United States Patent [19]

Spiteri

[11] 4,025,850
[45] May 24, 1977

[54] PASSIVE, SOLID STATE WIDE RANGE VOLTAGE CHECKER

[76] Inventor: Joseph Spiteri, P.O. Box 71, Harborcreek, Pa. 16421

[22] Filed: Oct. 1, 1975

[21] Appl. No.: 618,564

[52] U.S. Cl. .............................. 324/133; 324/119; 324/132
[51] Int. Cl.² .................. G01R 19/14; G01R 19/16
[58] Field of Search ........... 324/51, 72.5, 110, 119, 324/132, 133, 122, 29.5; 340/248 R, 248 B, 248 C, 249

[56] References Cited

UNITED STATES PATENTS

| | | | |
|---|---|---|---|
| 2,575,821 | 11/1951 | Linton | 324/51 X |
| 2,921,264 | 1/1960 | Sundt | 324/110 |
| 2,956,229 | 10/1960 | Henel | 324/122 X |
| 2,994,039 | 7/1961 | Parke | 324/132 X |
| 3,157,870 | 11/1964 | Marino et al. | 324/133 X |
| 3,281,816 | 10/1966 | Raymond | 340/249 |
| 3,355,729 | 11/1967 | Dayson | 340/248 R |
| 3,531,790 | 9/1970 | Staley | 324/133 UX |
| 3,534,354 | 10/1970 | Galginaitis | 324/133 X |
| 3,694,749 | 9/1972 | Woroble | 324/122 X |
| 3,771,049 | 11/1973 | Piccione | 324/122 X |
| 3,784,903 | 1/1974 | Thomas | 324/133 X |
| 3,878,459 | 4/1975 | Hanna | 324/133 X |
| 3,934,195 | 1/1976 | Shires | 324/72.5 |

FOREIGN PATENTS OR APPLICATIONS 1,931,994  1/1970  Germany .......................... 324/72.5

*Primary Examiner*—Gerard R. Strecker
*Attorney, Agent, or Firm*—Ralph Hammar

[57] ABSTRACT

A checker for a.c. and d.c. voltages in the range of 3 to 250 or more volts in which a single light emitting diode serves as an indicator for all voltages and the current through the light emitting diode is controlled by a transistor and a zener diode. The tester indicates a.c. or d.c. and polarity of d.c. voltages.

7 Claims, 3 Drawing Figures

PASSIVE, SOLID STATE WIDE RANGE VOLTAGE CHECKER

Voltage checkers have been made with a lamp which lights to indicate the presence of a voltage. This type of checker can be made in pocket size and is convenient to use but has a limited range so that several checkers are required to cover a wide range of voltages.

This invention is intended to combine the functions of several narrow range testers into a single unit without increase in size or change in the method of use. The same circuit and the same indicator used for a voltage of 3 volts is also used without change for volages of 250 volts and higher, a.c. or d.c.

Figure 1:
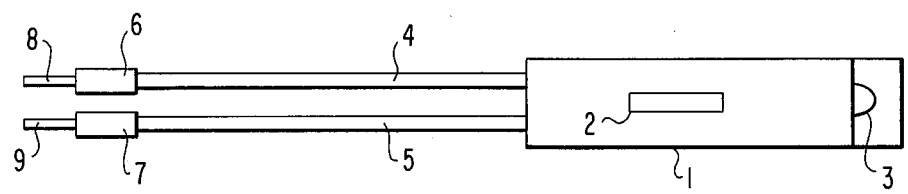
FIG. 1 is a plan view of a preferred form of voltage checker.

The tester has a housing 1 with a pencil clip 2 for carrying. At the upper end of the housing is an indicator such as a light emitting diode 3 and at the lower end of the housing are flexible leads 4, 5 terminating in insulated hand grip sections 6, 7 and terminals 8, 9 for making contact to the points at which the existence of voltage is to be determined. Low voltage sound emitters may be substituted for the light emitting diode to provide an audio indication. The existence of a voltage of 3 volts or to 250 or more volts is indicated by current flowing through the light emitting diode. All of the current for the light emitting diode flows through diode or rectifier 10, resistor 11, and transistor 12. The diode 10 changes a.c. to d.c., a necessary function. If a.c. were not rectified the tester would burn up. The half wave rectifier 10 is adequate. A full wave rectifier is not necessary. In the case of d.c. voltages, the half wave rectifier performs the additional function of indicating polarity. With a.c. voltages, the terminals may be reversed without changing the indication. With d.c. voltages an indication can be obtained only when the terminal 8 is connected to a positive voltage.

When the terminals 8, 9 are connected across an unknown a.c. voltage, transistor 12 is biased on by the voltage applied through resistor 14 to base or control electrode 12b causing a flow of current through resistor 11, emitter 12e, collector 12c and light emitting diode 3. A voltage limiting means such as zener diode 13, limits the sum of the voltage across resistor 11 (V) plus the emitter to base voltage (Veb) of the transistor to a value which cannot excede the rated voltage of the zener diode 13. The result is to limit the current through resistor 11 to a value less than the rated current of the light emitting diode, typically 15 milliamperes. Because of the voltage limiting effect of the zener diode 13, the transistor 12 sustains all voltages in excess of the voltage drop across the light emitting diode 3, and resistor 11, typically less than 3 volts. For this function the transistor acts as a variable resistor and the result is substantially constant current through the light emitting diode.

Figure 2:
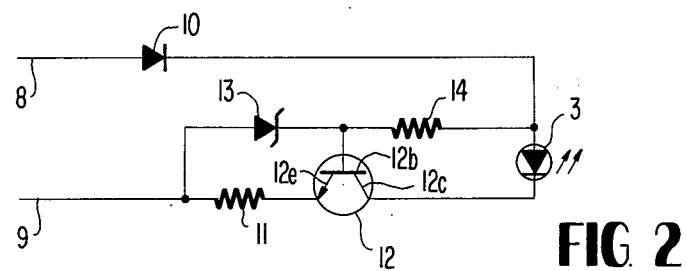
FIG. 2 is a circuit diagram using a NPN transistor.

Circuit values for the checker shown in FIG. 2 are:
Light emitting diode 3 (LSL-3L) Advacom, Inc.
Resistor 11 330 Ohms ½ watt Advacom, Inc.
Resistor 14 27000 Ohms ½ watt Advacom, Inc.
Zener diode 13 2.4 volt Solid State, Inc.
Diode 10 IN 4004 Advacom, Inc.
Transistor 12 MPS -A42 Solid State, Inc.

Figure 3:
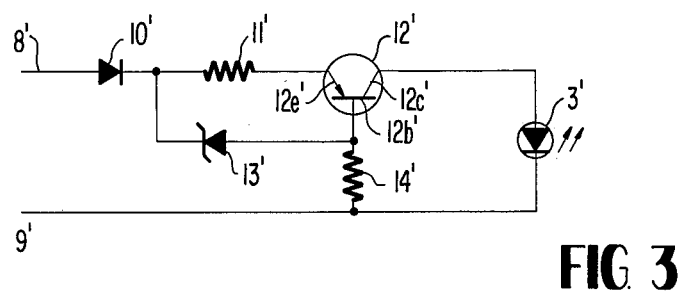
FIG. 3 is another circuit diagram using a PNP transistor.

FIG. 3 is the same as FIG. 2, except for the change in polarity required by the PNP transistor. Corresponding parts are indicated by the same reference numerals primed.

Other voltage limiting devices such as varistors may be substituted for the zeners 13, 13'.

I claim:

1. A passive total solid state pocket size voltage checker operative for testing voltages within a range of 3 to 250 volts comprising a housing, an indicating circuit within the housing comprising a rectifier, a resistor, a transistor, and an indicator in series with a pair of leads, said leads extending from the housing and having free ends provided with terminals for connection across an unknown voltage, said transistor having its emitter and collector in series with said resistor and said indicator, and means connected in said circuit for limiting the sum of the voltage across the resistor plus the emitter to base voltage of the transistor, and the transistor sustaining all voltage in excess of the voltage drop across the indicator and resistor.

2. The checker of claim 1 in which the indicator is a light emitting diode.

3. The checker of claim 1 in which the indicator is a sound emitter or like.

4. The checker of claim 1 in which the voltage limiting means is a zener.

5. The checker of claim 1 in which the voltage limiting means is a varistor.

6. The checker of claim 1 in which the voltage limiting means is a pn junction.

7. The checker of claim 1 in which the voltage limiting means is a semiconductor with a threshold voltage.

* * * * *